(12) United States Patent
Fukuda et al.

(10) Patent No.: US 12,154,818 B2
(45) Date of Patent: Nov. 26, 2024

(54) LAYERED SHEET, CONTAINER, CARRIER TAPE, AND ELECTRONIC COMPONENT PACKAGING BODY

(71) Applicant: DENKA COMPANY LIMITED, Tokyo (JP)

(72) Inventors: Yuko Fukuda, Tokyo (JP); Junpei Fujiwara, Tokyo (JP); Ryosuke Yanaka, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 164 days.

(21) Appl. No.: 17/793,538

(22) PCT Filed: Mar. 8, 2021

(86) PCT No.: PCT/JP2021/009012
§ 371 (c)(1),
(2) Date: Jul. 18, 2022

(87) PCT Pub. No.: WO2021/187198
PCT Pub. Date: Sep. 23, 2021

(65) Prior Publication Data
US 2023/0084488 A1 Mar. 16, 2023

(30) Foreign Application Priority Data
Mar. 19, 2020 (JP) ................ 2020-049712

(51) Int. Cl.
*B32B 27/20* (2006.01)
*B32B 27/08* (2006.01)
*H01L 21/683* (2006.01)

(52) U.S. Cl.
CPC .......... *H01L 21/6836* (2013.01); *B32B 27/08* (2013.01); *B32B 27/20* (2013.01);
(Continued)

(58) Field of Classification Search
CPC ............ B32B 2250/02; B32B 2250/24; B32B 2260/046; B32B 2264/101;
(Continued)

(56) References Cited

U.S. PATENT DOCUMENTS

2016/0238942 A1  8/2016  Ebihara et al.

FOREIGN PATENT DOCUMENTS

JP    H05-201467 A    8/1993
JP    H09-076422 A    3/1997
(Continued)

OTHER PUBLICATIONS

The International Bureau of WIPO, International Preliminary Report on Patentability issued in International Application No. PCT/JP2021/009012 (Sep. 29, 2022).
(Continued)

*Primary Examiner* — Lawrence D Ferguson
(74) *Attorney, Agent, or Firm* — Leydig, Voit & Mayer, Ltd.

(57) ABSTRACT

A layered sheet 10 includes a substrate layer 1, and surface layers 2 and 3 configured to be layered on at least one surface of the substrate layer 1. The substrate layer 1 contains a first thermoplastic resin and inorganic fillers. The surface layers 2 and 3 contain a second thermoplastic resin and a conductive material. A content of the inorganic fillers in the substrate layer 1 is 0.3 to 28 mass % based on a total amount of the substrate layer.

19 Claims, 3 Drawing Sheets

(52) U.S. Cl.
CPC ....... *B32B 2250/02* (2013.01); *B32B 2250/24* (2013.01); *B32B 2260/046* (2013.01); *B32B 2264/108* (2013.01); *B32B 2305/30* (2013.01); *B32B 2313/04* (2013.01); *B32B 2398/20* (2013.01); *B32B 2439/02* (2013.01)

(58) Field of Classification Search
CPC ........ B32B 2264/108; B32B 2264/301; B32B 2264/302; B32B 2270/00; B32B 2305/30; B32B 2307/202; B32B 2307/732; B32B 2307/7376; B32B 2313/04; B32B 2398/20; B32B 2439/00; B32B 2439/02; B32B 2457/00; B32B 27/08; B32B 27/18; B32B 27/20; B32B 27/302; B32B 27/36; B32B 27/365; C07K 16/2803; C07K 16/2896; G01N 2800/2821; G01N 2800/2835; G01N 2800/285; G01N 2800/60; G01N 33/53; G01N 33/68; G01N 33/6896; H01L 21/6836
See application file for complete search history.

(56) References Cited

FOREIGN PATENT DOCUMENTS

| JP | H09-076425 A | 3/1997 |
|---|---|---|
| JP | H09-174769 A | 7/1997 |
| JP | 2002-326318 A | 11/2002 |
| JP | 2003-292760 A | 10/2003 |
| JP | 2004-091691 A | 3/2004 |
| JP | 2005-350621 A | 12/2005 |
| JP | 2009-184681 A | 8/2009 |
| JP | 4630046 B2 | 2/2011 |
| JP | 2014-193560 A | 10/2014 |
| JP | 5894578 B2 | 3/2016 |
| WO | WO 2011/118522 A1 | 9/2011 |
| WO | WO 2012/137630 A1 | 10/2012 |
| WO | WO 2018/084129 A1 | 5/2018 |

OTHER PUBLICATIONS

European Patent Office, Extended European Search Report in European Patent Application No. 21772455.8 (Jun. 21, 2023).
Japan Patent Office, International Search Report in International Application No. PCT/JP2021/009012 (May 18, 2021).
State Intellectual Property Office, Office Action issued in Chinese Patent Application No. 202180006231.1 (Oct. 27, 2023).
Jiawen Bao, "High-Temperature Resistant Resin Matrix Composites and the Applications", *Aviation Industry Press*, pp. 280-281 (2018).
Hesheng Luo, "Newly Compiled Handbook of Plastic Materials", *Guangdong Science & Technology Press*, pp. 100-103 (1998) (*erroneous citation of page numbers indicated by the foreign patent office communication has been corrected here*).

LAYERED SHEET, CONTAINER, CARRIER TAPE, AND ELECTRONIC COMPONENT PACKAGING BODY

CROSS-REFERENCE TO RELATED APPLICATIONS

This patent application is the U.S. national phase of International Application No. PCT/JP2021/009012, filed on Mar. 8, 2021, which claims the benefit of Japanese Patent Application No. 2020-049712, filed Mar. 19, 2020, the disclosures of which are incorporated herein by reference in their entireties for all purposes.

TECHNICAL FIELD

The present invention relates to a layered sheet, a container, a carrier tape, and an electronic component packaging body.

BACKGROUND ART

A vacuum-molded tray obtained by performing heat molding of a resin sheet, an embossed carrier tape, or the like is used as a packaging container for intermediate products of an industrial product such as an electronic instrument or an automobiles. Further, regarding sheets for packaging containers of ICs incompatible with static electricity and various kinds of components having an IC, layered sheets in which a surface layer containing a thermoplastic resin and a conductive material such as carbon black is layered on a substrate layer formed of a thermoplastic resin are used (for example, refer to the following Patent Literature 1 to Patent Literature 3). When a carrier tape is produced, a slit article or the like obtained by performing slit processing of a raw sheet as necessary is used. In an embossed carrier tape, feeding holes or the like used for conveyance in an enclosing step or the like of various kinds of electronic components such as ICs are provided (for example, refer to Patent Literature 4).

CITATION LIST

Patent Literature

[Patent Literature 1] Japanese Unexamined Patent Publication No. H9-76422
[Patent Literature 2] Japanese Unexamined Patent Publication No. H9-76425
[Patent Literature 3] Japanese Unexamined Patent Publication No. H9-174769
[Patent Literature 4] Japanese Unexamined Patent Publication No. H5-201467

SUMMARY OF INVENTION

Technical Problem

Recently, as miniaturization of electronic components such as ICs progresses, it is required that burrs generated in a cross section thereof be reduced in size when slit processing of a raw sheet is performed or feeding holes or the like are punched with regard to the performance of a carrier tape or the like. On the other hand, burrs due to punching or slit processing are not only less likely to occur in resin sheets for forming an embossed carrier tape, but sufficient folding resistance is necessary so that cracking due to known sheet molding methods such as vacuum molding, pressure molding, and press molding does not easily occur.

An object of the present invention is to provide a layered sheet, which has sufficient folding resistance and in which burrs due to punching or slit processing are unlikely to be generated, and a container, a carrier tape, and an electronic component packaging body which are obtained using it.

Solution to Problem

In order to resolve the foregoing problems, according to an aspect of the present invention, there is provided a layered sheet comprising: a substrate layer: and a surface layer configured to be layered on at least one surface of the substrate layer, wherein the substrate layer contains a first thermoplastic resin and inorganic fillers, wherein the surface layer contains a second thermoplastic resin and a conductive material, and wherein a content of the inorganic fillers in the substrate layer is 0.3 to 28 mass % based on a total amount of the substrate layer.

In the foregoing layered sheet, it is preferable that an average primary particle size of the inorganic fillers be 25 nm to 5.0 μm.

The foregoing substrate layer can contain carbon black as the inorganic fillers.

The foregoing substrate layer can contain, as the first thermoplastic resin, a thermoplastic resin of the same kind as the second thermoplastic resin contained in the surface layer and can contain, as the inorganic fillers, inorganic fillers formed of the same material as the conductive material contained in the surface layer.

A content of the conductive material in the foregoing surface layer can be 10 to 30 mass % based on a total amount of the surface layer.

A thickness of the foregoing substrate layer can be 70% to 97% of a thickness of the entire layered sheet.

According to another aspect of the present invention, there is provided a container configured to be a molded body of the foregoing layered sheet.

According to another aspect of the present invention, there is provided a carrier tape configured to be a molded body of the foregoing layered sheet and be provided with an accommodation portion capable of accommodating an article.

According to another aspect of the present invention, there is provided an electronic component packaging body including the foregoing carrier tape, an electronic component configured to be accommodated in the accommodation portion of the carrier tape, and a cover film configured to be adhered to the carrier tape as a lid material.

Advantageous Effects of Invention

According to the present invention, it is possible to provide a layered sheet, which has sufficient folding resistance and in which burrs due to punching or slit processing are unlikely to be generated, and a container, a carrier tape, and an electronic component packaging body which are obtained using it.

DESCRIPTION OF EMBODIMENTS

Hereinafter, a favorable embodiment of the present invention will be described in detail.

[Layered Sheet]

A layered sheet of the present embodiment includes a substrate layer, and a surface layer configured to be layered on at least one surface of the substrate layer. The substrate layer contains a first thermoplastic resin and inorganic fillers. The surface layer contains a second thermoplastic resin and a conductive material. The first thermoplastic resin and the second thermoplastic resin may be the same resins or may be resins different from each other.

Figure 1:
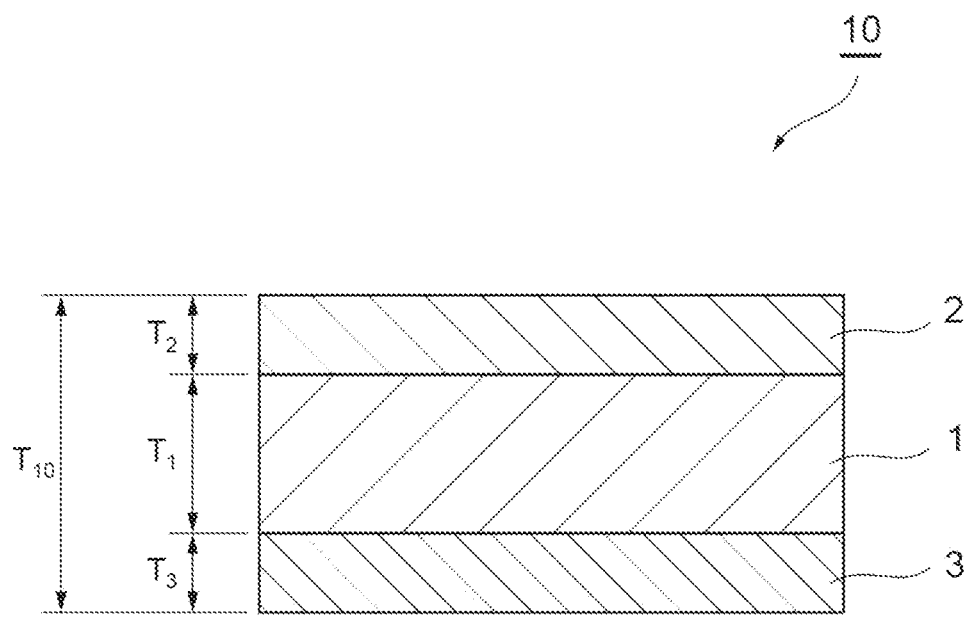
FIG. 1 is a schematic cross-sectional view illustrating an embodiment of a layered sheet.

FIG. 1 is a schematic cross-sectional view illustrating an embodiment of the layered sheet of the present embodiment. A layered sheet 10 illustrated in FIG. 1 includes a substrate layer 1, and surface layers 2 and 3 layered on both surfaces of the substrate layer 1. The surface layer may be layered on only one surface of the substrate layer 1.

<Substrate Layer>

Regarding the first thermoplastic resin contained in the substrate layer, a styrene-based resin, an olefin-based resin, a polycarbonate resin, a polyester resin (PET, PBT, or the like), or the like can be adopted. Regarding these thermoplastic resins, one kind can be used alone, or two or more kinds can be used in combination.

Regarding the styrene-based resin, a polystyrene resin (GPPS), a high-impact polystyrene resin (a rubber-modified styrene resin, HIPS), and a copolymer of a monomer (acrylonitrile, butadiene, ethylene-propylene-diene, butadiene, methyl methacrylate, or the like) and styrene (AS, ABS AES, MS, or the like) can be adopted.

Examples of an aromatic vinyl monomer constituting the styrene-based resin include styrene, vinyltoluene, o-methyl styrene, p-methyl styrene, p-tert-butyl styrene, 1,3-dimethyl styrene, α-methyl styrene, vinyl naphthalene, vinyl anthracene, and 1,1-diphenylethylene. Among these aromatic vinyl monomers, styrene, vinyltoluene, o-methyl styrene, or the like can be used, and styrene is preferably used.

A high-impact polystyrene resin is a polystyrene resin in which a styrene monomer is graft-polymerized with a rubber-like elastic substance having conjugated diene as a main component. Regarding the conjugated diene to be used, 1,3-butadiene, 2-methyl-1,3-butadiene (isoprene), 2,3-dimethyl-1,3-butadiene, 1,3-pentadiene, 1,3-hexadiene, or the like can be adopted. Among these, 1,3-butadiene is preferably used.

Examples of the olefin-based resin include a polyethylene resin such as high-density polyethylene, ultra-low-density polyethylene, and linear-low-density polyethylene; a polypropylene resin; and an ethylene-α olefin copolymer in which ethylene is copolymerized with α olefin-based hydrocarbon having the number of carbon atoms of 3 or larger, such as propylene, 1-butene, or 1-hexene. An olefin-based resin may be a copolymer of olefin and a monomer having a polar group which can be copolymerized with olefin. Regarding such a resin, ternary copolymers such as an ethylene-vinyl acetate copolymer, an ethylene-acrylic acid copolymer, an ethylene-ethyl acrylate copolymer, an ethylene-methacrylic acid ester copolymer, an ethylene-vinyl acetate-vinyl chloride copolymer, or the like can be adopted. These olefin-based resins can be used alone or can be used together with other olefin-based resins.

Regarding the polycarbonate resin, an aromatic polycarbonate resin, an aliphatic polycarbonate resin, an aromatic-aliphatic polycarbonate, or the like can be adopted. An aromatic polycarbonate resin is normally classified as engineering plastic, and it is possible to use a general resin which can be obtained through polycondensation between bisphenol A and phosgene or polycondensation between bisphenol A and carbonate ester. It is preferable to adopt an aromatic polycarbonate resin in regard to mechanical strength.

A resin which can be obtained through a polycondensation reaction between a dicarboxylic acid and diol can be used as a polyester resin. Examples of the dicarboxylic acid include a phthalic acid, an isophthalic acid, a terephthalic acid, a 2-methyl terephthalic acid, a 4,4'-diphenyl dicarboxylic acid, a 5-sulfonic isophthalic acid, a 2,6-naphthalene dicarboxylic acid, a malonic acid, a succinic acid, a glutaric acid, an adipic acid, a maleic acid, and a maleic anhydride. Regarding these, one kind can be used alone, or two or more kinds can be used in combination. Examples of the diol include ethylene glycol, diethylene glycol, polyethylene glycol, propylene glycol, polypropylene glycol, and 1,3-propanediol. Regarding these, one kind can be used alone, or two or more kinds can be used in combination.

It is preferable that the substrate layer contain one or more kinds of a styrene-based resin, a polycarbonate resin, and a polyester resin.

Regarding the inorganic fillers contained in the substrate layer, carbon black, graphite, CNT, black lead, calcium carbonate, talc, silica, or the like can be adopted. Regarding these inorganic fillers, one kind can be used alone, or two or more kinds can be used in combination.

The inorganic fillers may be subjected to surface modification such as oxidation treatment or coating in order to improve compatibility or dispersity with respect to the thermoplastic resin.

Forms of the inorganic fillers are not particularly limited, and a spherical shape, a needle shape, a plate shape, or a scale shape may be adopted.

From the viewpoint of achieving both curbing of occurrence of burrs and high-level folding resistance, the average primary particle size of the inorganic fillers is preferably 25 nm to 5.0 μm, is more preferably 25 nm to 100 nm, and is further preferably 25 nm to 55 nm.

The average primary particle size of the inorganic fillers is obtained by the following method.

First, using an ultrasonic disperser, dispersion samples are prepared by dispersing samples of the inorganic fillers into chloroform for ten minutes under conditions of 150 kHz and 0.4 kW. The dispersion samples are sprinkled over a carbon-reinforced support film and are fixed thereto, and images thereof are captured using a transmission electron microscope (manufactured by JEOL Ltd., JEM-2100). Particle sizes of 1,000 or more inorganic fillers (maximum diameters in a case of shapes other than spherical shapes) are randomly measured using an Endter device from the images magnified to 50,000 to 200,000 times, and the average value thereof is adopted as the average primary particle size.

A content of the inorganic fillers in the substrate layer can be 0.3 to 28 mass % based on the total amount of the substrate layer. The layered sheet including such a substrate layer has sufficient folding resistance and may become a layered sheet in which burrs due to punching or slit processing are unlikely to be generated. From the viewpoint of further curbing burrs, the content of the inorganic fillers is preferably 0.9 to 28 mass % and is more preferably 6 to 28 mass % based on the total amount of the substrate layer. From the viewpoint of folding resistance, the content of the inorganic fillers is preferably 0.3 to 25 mass % and is more preferably 0.3 to 10 mass % based on the total amount of the substrate layer.

From viewpoints similar to those described above, the content of the inorganic fillers in the substrate layer may be 0.3 to 28 mass %, may be 0.9 to 28 mass %, may be 6 to 28 mass %, may be 0.3 to 25 mass %, or may be 0.3 to 10 mass % based on the total mass of masses of the first thermoplastic resin and the inorganic fillers.

Various additives such as a plasticizer, a processing aid, or a conductive material can be added to the substrate layer.

A recycled material may be mixed into the substrate layer. Examples of the recycled material include materials obtained by crushing both end portions of a layered sheet in which a substrate layer and surface layers are layered, and end materials obtained during a manufacturing step. A mixed proportion of the recycled material in the substrate layer can be 2 to 30 mass % and may be 2 to 20 mass % or may be 2 to 15 mass % based on the total amount of the substrate layer.

The substrate layer can contain, as the first thermoplastic resin, a thermoplastic resin of the same kind as the second thermoplastic resin contained in the surface layer and can contain, as the inorganic fillers, inorganic fillers formed of the same material as the conductive material contained in the surface layer. Such a substrate layer can be formed by mixing the recycled material described above. In this case, a mixed amount of the recycled material can be appropriately set such that the content of the inorganic fillers in the substrate layer is within the range described above.

A thickness of the substrate layer may be 100 to 300 μm. The thickness of the substrate layer ($T_1$ in FIG. 1) can be 70% to 97% of a thickness of the entire layered sheet ($T_0$ in FIG. 1). When the surface layer is provided on both surfaces of the substrate layer, the thickness of the substrate layer is preferably 70% to 94% of the thickness of the entire layered sheet. When the surface layer is provided on one surface of the substrate layer, the thickness of the substrate layer is preferably 85% to 97% of the thickness of the entire layered sheet.

<Surface Layer>

It is possible to use a resin similar to the first thermoplastic resin described above as the second thermoplastic resin contained in the surface layer.

The surface layer preferably contains one or more kinds of a styrene-based resin, a polycarbonate resin, and a polyester resin.

Regarding the conductive material contained in the surface layer, carbon black, graphite, CNT, black lead, Ketjen black, or the like can be adopted. Regarding these conductive materials, one kind can be used alone, or two or more kinds can be used in combination.

The conductive material may be particles. In this case, the average primary particle size of the conductive material may be 10 nm to 5.0 μm or may be 20 to 50 nm. The average primary particle size of the conductive material can be obtained by a method similar to that for the average primary particle size of the inorganic fillers described above.

The content of the conductive material in the surface layer can be 10 to 30 mass % or may be 20 to 30 mass % based on the total amount of the surface layer.

The surface layer preferably has a surface resistivity of $10^2$ to $10^{10}$ Ω/□. If the surface resistivity of the surface layer is within this range, damage to an electronic component due to static electricity or damage to an electronic component due to electricity flowing in from the outside is easily prevented.

Various additives such as a lubricant, a plasticizer, or a processing aid can be added to the surface layer.

A thickness of the surface layer may be 10 to 100 μm. When the surface layer is provided on both surfaces of the substrate layer, the thicknesses of the respective surface layers ($T_2$ and $T_3$ in FIG. 1) may be the same or may be different from each other.

A thickness of the layered sheet can be appropriately set in accordance with the application, and it can be 100 μm to 1.0 mm. When it is used as a packaging container for miniaturized electronic components or a carrier tape, the thickness can be 100 to 300 μm, for example.

The layered sheet of the present embodiment may be a raw sheet which has not been subjected to processing or may be a sheet subjected to predetermined processing, such as a slit article.

The layered sheet of the present embodiment can be molded into a shape according to the application by a known heat molding method such as a vacuum molding method, a pressure molding method, or a press molding method.

The layered sheet of the present embodiment can be used as a material for active components such as ICs, components including an IC, passive components such as capacitors and connectors, and a packaging container for mechanism components, and can be favorably used for vacuum molding trays, magazines, and carrier tapes provided with embossing (embossed carrier tape).

According to the layered sheet of the present embodiment, since buns due to punching or slit processing are unlikely to be generated, burrs generated during slitting in a slit article can be extremely reduced in size, and burrs generated in a cross section during punching of feeding holes in an embossed carrier tape can be extremely reduced. In addition, according to the layered sheet of the present embodiment, since it has sufficient folding resistance, occurrence of cracking at the time of molding can be curbed.

[Method for Manufacturing Layered Sheet]

The layered sheet according to the present embodiment can be manufactured by a general method. For example, a pellet obtained by kneading and pelletizing a raw material for constituting a substrate layer is prepared as a substrate layer forming composition for forming a substrate layer using a known method such as an extruder, and a pellet obtained by kneading and pelletizing a raw material for constituting a surface layer is prepared as a surface layer forming composition for forming a surface layer using a known method such as an extruder, so that a layered sheet can be manufactured using these pellets by a known method such as an extruder. A temperature of the extruder can be set to 200° C. to 280° C., for example.

The substrate layer and the surface layer may be layered in stages by a heat lamination method, a dry lamination method, an extrusion lamination method, or the like after each of the substrate layer forming composition and the surface layer forming composition is molded in a sheet shape or a film shape using different extruders, or a surface layer formed of a surface layer forming composition may be layered on one surface or both surfaces of a substrate layer sheet molded with a substrate layer forming composition in advance by a method such as extrusion coating.

In addition, the layered sheet can be manufactured by individually supplying raw materials for constituting the substrate layer and the surface layer (for example, the foregoing pellets) to different extruders by a multi-layer coextrusion method such as extrusion molding using a multi-layer T die having a multi-manifold or T die method extrusion molding using a feed block. This method is preferable in that a layered sheet can be obtained in one step.

When a recycled material is mixed into the substrate layer, a raw material for the substrate layer and a recycled material can be supplied to an extruder which forms the substrate layer. In this case, the mixed amount of the raw material to be supplied to the extruder is appropriately adjusted in accordance with the kind and the mixed amount of the recycled material such that a predetermined composition for the substrate layer can be obtained.

[Container, Carrier Tape, and Electronic Component Packaging Body]

A container of the present embodiment is a molded body of the layered sheet according to the foregoing present embodiment. The container can be obtained by molding the layered sheet according to the present embodiment in a shape according to the application. Regarding a molding method, a known heat molding method such as a vacuum molding method, a pressure molding method, or a press molding method can be used.

Regarding a molding temperature, 100° C. to 500° C. can be adopted.

Figure 2:
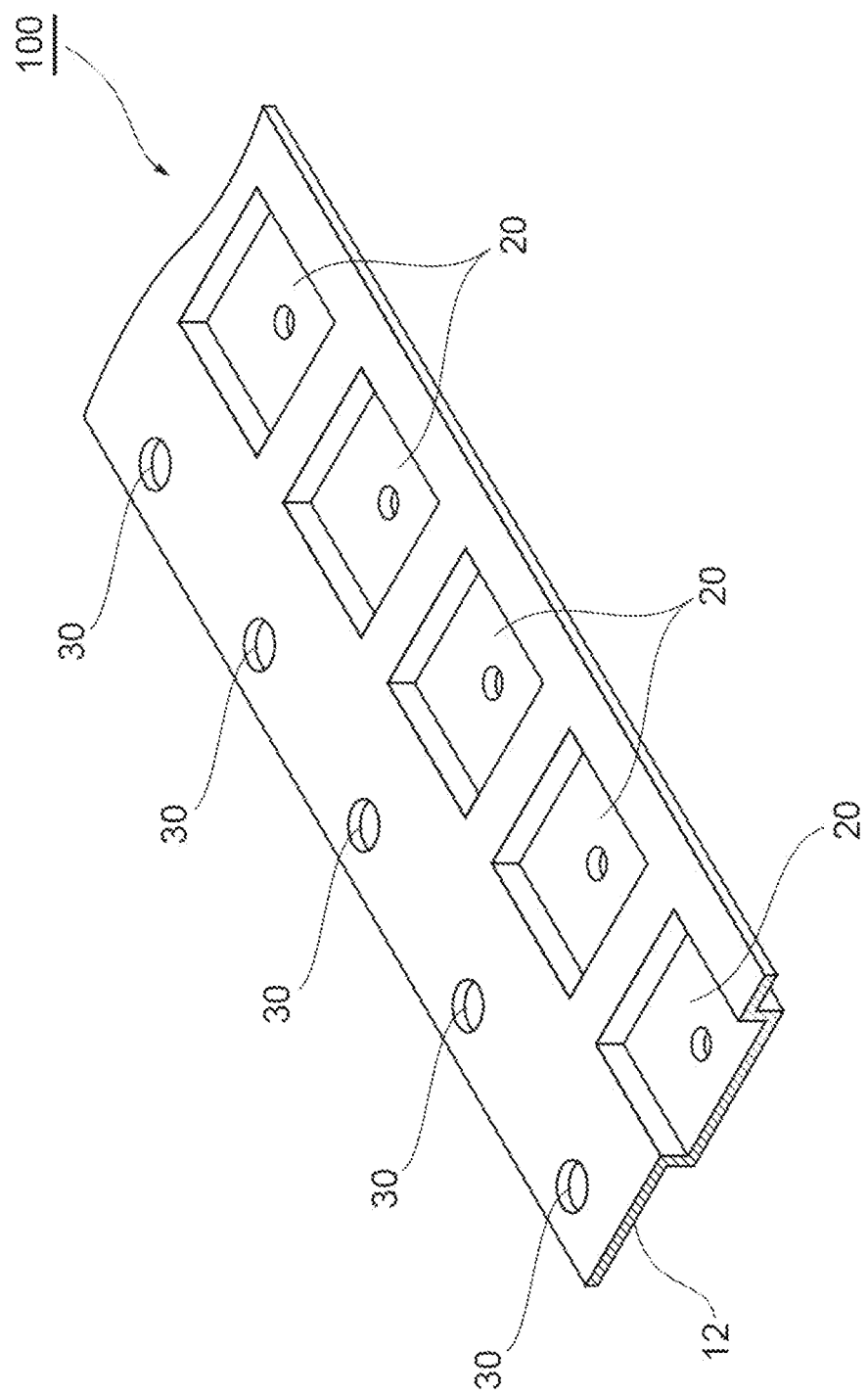
FIG. 2 is a partially cut-out perspective view illustrating an embodiment of a carrier tape.

A carrier tape of the present embodiment is a molded body of the layered sheet according to the foregoing present embodiment and is provided with accommodation portions capable of accommodating articles. FIG. 2 is a perspective view illustrating an embodiment of the carrier tape. A carrier tape 100 illustrated in FIG. 2 is an embossed carrier tape constituted of a molded body 12 of the layered sheet according to the present embodiment provided with accommodation portions 20 through emboss molding. The molded body 12 is provided with feeding holes 30 which can be used for conveyance in an enclosing step or the like of various kinds of electronic components such as ICs. Bottom portions of the accommodation portions 20 may be provided with a hole for inspection of electronic components.

For example, the feeding holes 30 can be provided through punching processing. In the layered sheet according to the present embodiment, since burrs generated in a punched cross section can be extremely reduced, even when diameters of the feeding holes 30 are small, incorporation of a foreign matter into components due to separation of burrs and an influence of a short circuit at the time of mounting according to this can be sufficiently reduced. For this reason, the carrier tape of the present embodiment is favorable as a packaging container for miniaturized electronic components.

In the carrier tape of the present embodiment, a punching burr ratio in the feeding holes having the foregoing shape can be 4.0% or lower. Here, the punching burr ratio means a ratio of the area of burrs to a predetermined punched area having no burrs generated therein when viewed in a punching direction. For example, when the punched shape is a perfect circle, the punched area indicates a perfectly circular area having no burrs.

The carrier tape of the present embodiment can be wound in a reel shape.

The carrier tape of the present embodiment is favorable as a container for packaging electronic components. Examples of the electronic components include ICs, light emitting diodes (LEDs), resistors, liquid crystals, capacitors, transistors, piezoelectric element registers, filters, crystal oscillators, crystal vibrators, diodes, connectors, switches, volumes, relays, inductors, and the like. The electronic components may be intermediate products using the foregoing components or may be final products.

Figure 3:
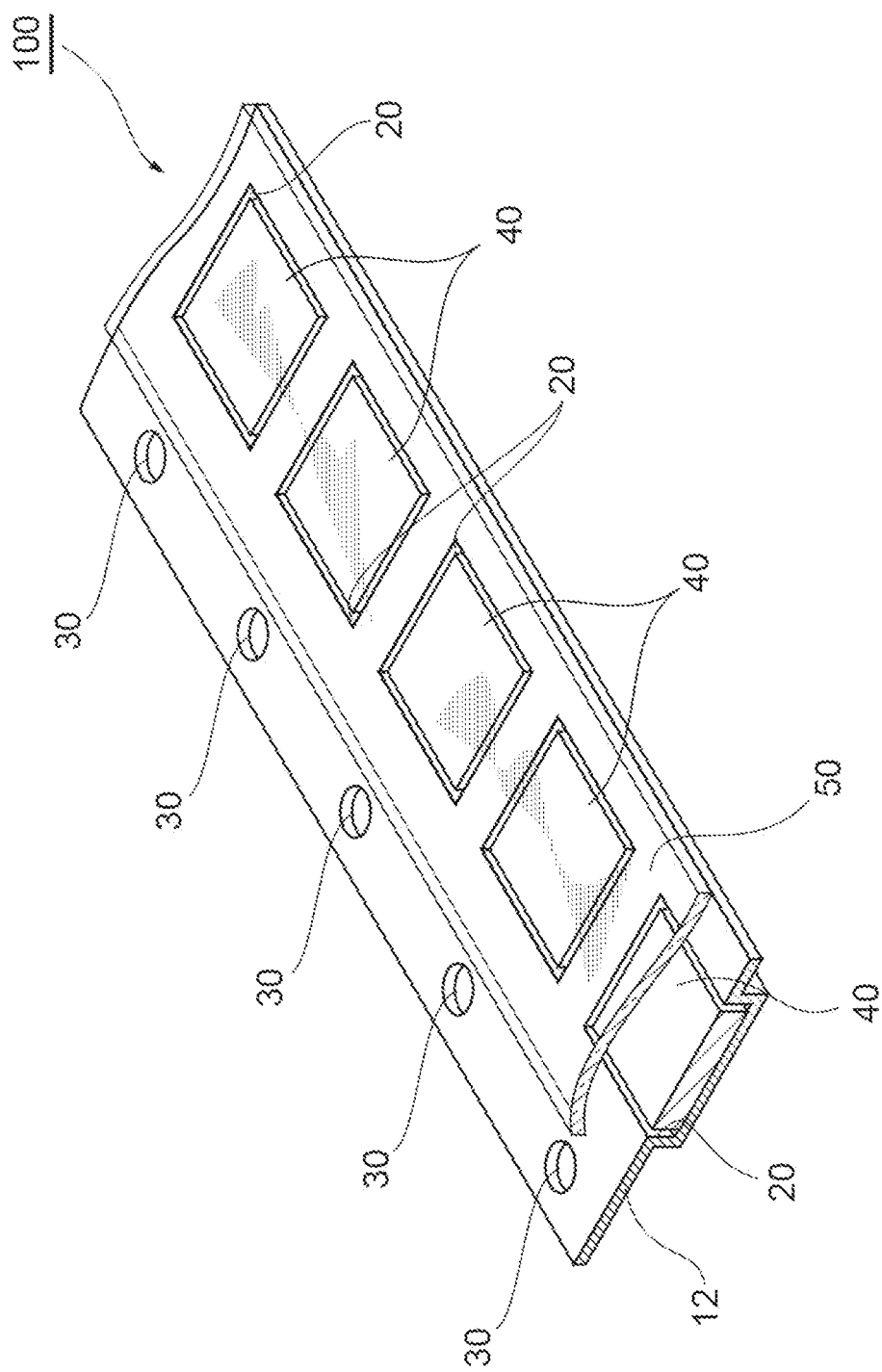
FIG. 3 is a partially cut-out perspective view illustrating an embodiment of an electronic component packaging body.

The electronic component packaging body of the present embodiment includes the carrier tape of the foregoing present embodiment, the electronic components accommodated in the accommodation portions of the carrier tape, and a cover film adhered to the carrier tape as a lid material. FIG. 3 is a partially cut-out perspective view illustrating an embodiment of the electronic component packaging body. An electronic component packaging body 200 illustrated in FIG. 3 includes the embossed carrier tape constituted of the molded body 12 of the layered sheet according to the present embodiment provided with the accommodation portions 20 and the feeding holes 30, electronic components 40 accommodated in the accommodation portions 20, and a cover film 50 adhered to the embossed carrier tape.

Examples of the cover film include films disclosed in Japanese Patent No. 4630046 and Japanese Patent No. 5894578.

The cover film can be adhered to an upper surface of the embossed carrier tape accommodating electronic components through heat sealing.

The electronic component packaging body of the present embodiment can be used for storage and conveyance of electronic components as a carrier tape body wound in a reel shape.

EXAMPLE

Hereinafter, the present invention will be more specifically described using Examples and Comparative Examples, but the present invention is not limited to the following examples.

[Production of Layered Sheet]

Examples 1 to 17, Comparative Examples 1 to 2

Each of the raw materials shown in Tables 1 and 2 was measured to obtain the composition ratios (mass %) shown in the tables. After they were evenly mixed using a high-speed mixer, the mixture was kneaded using a vented-type twin screw extruder ($\phi$45 mm) and was pelletized by a strand cutting method, and therefore each of a surface layer forming resin composition and a substrate layer forming resin composition was obtained. Using these compositions, by a feed block method using an extruder of $\phi$65 mm (L/D=28), an extruder of $\phi$40 mm (L/D=26), and a T die having a width of 500 mm, a layered sheet having a layered structure (surface layer/substrate layer/surface layer) was produced such that the surface layers formed on both surfaces of the substrate layer had almost the same thickness. The thickness of the layered sheet was 0.25 mm, and the proportion of the thickness (surface layer/substrate layer/surface layer) was 1:18:1.

Details of the raw materials shown in Tables 1 and 2 are as follows.

Thermoplastic resin 1: polycarbonate resin (manufactured by Teijin Ltd., product name "Panlite L-1225L")

Thermoplastic resin 2: polybutylene terephthalate resin (manufactured by Mitsubishi Engineering-Plastics Corporation, product name "NOVADURAN 5010R8M")

Thermoplastic resin 3: high-impact polystyrene resin (manufactured by Denka Co., Ltd., product name "H700")

Thermoplastic resin 4: acrylonitrile-butadiene-styrene copolymer (manufactured by Denka Co., Ltd., product name "SE-10")

Thermoplastic resin 5: acrylonitrile-styrene copolymer (manufactured by Denka Co., Ltd., product name "GR-ATR")

Conductive material 1: carbon black (manufactured by Denka Co., Ltd., product name "Denka Black particles", average primary particle size: 35 nm)

Inorganic filler 1: carbon black (manufactured by Tokai Carbon Co., Ltd., product name "TOKABLAC #5500", average primary particle size: 25 nm)

Inorganic filler 2: carbon black (manufactured by Asahi Carbon Co., Ltd., product name "Asahi #51", average primary particle size: 91 nm)

Inorganic filler 3: silica (manufactured by Admatechs Co., Ltd., product name "YA010C", average primary particle size: 10 nm)

Inorganic filler 4: silica (manufactured by NIPPON SHOKUBAI CO LTD., product name "KE-P10", average primary particle size: 100 nm)

The average primary particle sizes of the conductive material and the inorganic fillers were obtained by the following method.

First, using an ultrasonic disperser, dispersion samples were prepared by dispersing samples of the inorganic fillers and the conductive material into chloroform for ten minutes under conditions of 150 kHz and 0.4 kW. The dispersion samples were sprinkled over a carbon-reinforced support film and were fixed thereto, and images thereof were captured using a transmission electron microscope (manufactured by JEOL Ltd., JEM-2100). The particle sizes of 1,000 or more inorganic fillers (maximum diameters in a case of shapes other than spherical shapes) were randomly measured using an Endter device from the images magnified to 50,000 to 200,000 times, and the average value thereof was adopted as the average primary particle size.

[Evaluation of Layered Sheet]

Sampling was performed in an extrusion direction of the layered sheet, and evaluation was performed by the method described below. The results are collectively shown in Tables 1 and 2.

(1) Punching Burr Ratio

In a sheet sample which was left unattended for 24 hours under an atmosphere at a temperature of 23° C. and a relative humidity of 50%, punched holes were provided using a vacuum rotary molding machine (CT8/24) manufactured by Muehlbauer under an atmosphere at a temperature of 23° C. and a relative humidity of 50%. Punching was performed using a punching device including a columnar punching pin having a sprocket hole pin tip diameter of 1.5 mm and a die hole having a diameter of 1.58 mm at a speed of 240 m/h.

Images of the sheet punched holes formed as described above were captured in a light source environment having a vertical illumination of 0%, a transmittance of 40%, and a ring of 0% using a microscopic measurement instrument (manufactured by Mitutoyo Corporation, product name "MF-A1720H (imaging unit 6D)"). In the captured images, using Adobe Photoshop Elements 14 (Adobe, product name), a threshold 128 was designated for a dual gradation filter, and processing was performed such that only the sprocket hole part became white. The number of pixels corresponding to the sizes of the holes having a diameter of 1.5 mm was set as "the number of white pixels of the sprocket holes having no burrs". The number of white pixels was recorded, and the punching burr ratio was obtained from the following expression.

Punching burr ratio (%)=(1−(the recorded number of white pixels)/(the number of white pixels of the sprocket holes having no burrs))×100

(2) Folding Resistance

From the sheet sample, a test piece having a length of 150 mm, a width of 15 mm, and a thickness of 0.25 mm in the sheet extrusion direction was produced based on JIS-P-8115 (2001). This test piece was left unattended for 24 hours under an atmosphere at a temperature of 23° C. and a relative humidity of 50%, and thereafter, MIT folding resistance was measured using an MIT folding fatigue resistance tester of Toyo Seiki Seisaku-sho, Ltd. under an atmosphere at a temperature of 23° C. and a relative humidity of 50%. Measurement was performed under conditions of a folding angle of 135 degrees, a folding speed of 175 times per minute, and a measurement load of 250 g. While this measurement was repeated, the number of times of folding when the test piece was cut was evaluated as the folding resistance.

TABLE 1

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Surface layer | Thermoplastic resin 1 | 50 | 50 | 50 | 50 | 50 | 50 | 50 | 50 | 50 | 50 |
| | Thermoplastic resin 2 | 25 | 25 | 25 | 25 | 25 | 25 | 25 | 25 | 25 | 25 |
| | Thermoplastic resin 3 | — | — | — | — | — | — | — | — | — | — |
| | Conductive material 1 | 25 | 25 | 25 | 25 | 25 | 25 | 25 | 25 | 25 | 25 |
| Substrate layer | Thermoplastic resin 1 | — | — | — | — | — | — | 2 | 2 | 2 | 2 |
| | Thermoplastic resin 2 | — | — | — | — | — | — | 1 | 1 | 1 | 1 |
| | Thermoplastic resin 3 | — | — | — | — | — | — | — | — | — | — |
| | Thermoplastic resin 4 | 94.7 | 94 | 76 | 75 | 72 | 80 | 93 | 76 | 75 | 75 |
| | Thermoplastic resin 5 | 5 | 5 | 21 | — | — | 17 | 3 | 17 | 16 | 11 |
| | Conductive material 1 | — | — | — | — | — | — | 1 | 1 | 1 | 1 |
| | inorganic filler 1 | 0.3 | 1 | 3 | 25 | 28 | — | — | 3 | 5 | 10 |
| | Inorganic filler 2 | — | — | — | — | — | 3 | — | — | — | — |
| | Inorganic filler 3 | — | — | — | — | — | — | — | — | — | — |
| | Inorganic filler 4 | — | — | — | — | — | — | — | — | — | — |
| Evaluation | Punching burr ratio (%) | 3.9 | 3.5 | 2.2 | 1.3 | 1.5 | 2.8 | 3.4 | 2.3 | 2.0 | 1.0 |
| | Folding resistance (times) | 205 | 220 | 120 | 80 | 64 | 145 | 163 | 127 | 150 | 200 |

TABLE 2

| | | Example 11 | Example 12 | Example 13 | Example 14 | Example 15 | Example 16 | Example 17 | Comparative Example 1 | Comparative Example 2 |
|---|---|---|---|---|---|---|---|---|---|---|
| Surface layer | Thermoplastic resin 1 | 50 | 50 | 50 | 50 | — | 50 | — | 50 | 60 |
| | Thermoplastic resin 2 | 25 | 25 | 25 | 25 | — | 25 | — | 25 | 15 |
| | Thermoplastic resin 3 | — | — | — | — | 80 | — | 60 | — | — |
| | Conductive material 1 | 25 | 25 | 25 | 25 | 20 | 25 | 40 | 25 | 25 |
| Substrate layer | Thermoplastic resin 1 | 2 | 2 | 2 | 2 | — | — | — | — | — |
| | Thermoplastic resin 2 | 1 | 1 | 1 | 1 | — | — | — | — | — |
| | Thermoplastic resin 3 | — | — | — | — | 79 | — | 99 | — | — |
| | Thermoplastic resin 4 | 71 | 80 | 93 | 71 | — | 99 | — | 95 | 40 |
| | Thermoplastic resin 5 | — | 13 | — | — | — | — | — | 5 | 30 |
| | Conductive material 1 | 1 | 1 | 1 | 1 | 1 | — | — | — | — |
| | Inorganic filler 1 | 25 | — | — | — | 20 | 1 | — | — | — |
| | Inorganic filler 2 | — | 3 | — | — | — | — | — | — | — |
| | Inorganic filler 3 | — | — | 3 | — | — | — | 1 | — | — |
| | Inorganic filler 4 | — | — | — | 25 | — | — | — | — | 30 |
| Evaluation | Punching burr ratio (%) | 1.4 | 2.7 | 3.0 | 2.2 | 2.8 | 3.8 | 3.9 | 4.1 | 2.2 |
| | Folding resistance (times) | 90 | 110 | 152 | 40 | 1,000 | 160 | >1,000 | 200 | 1 |

As shown in Tables 1 and 2, it was confirmed that the layered sheets of Examples 1 to 17 had the folding resistance of 10 times or more and the punching burr ratio of 4.0% or lower. Particularly, the layered sheets of Examples 9 and 10 could achieve both the punching burr ratio of 2.0% or lower and the folding resistance of 100 times or more. Meanwhile, the punching burr ratio of the layered sheet of Comparative Example 1 exceeded 4.0%, and the folding resistance of the layered sheet of Comparative Example 1 was fewer than 10 times.

REFERENCE SIGNS LIST

1 Substrate layer
2, 3 Surface layer
10 Layered sheet
12 Molded body
20 Accommodation portion
30 Feeding holes
40 Electronic component
50 Cover film
100 Carrier tape
200 Electronic component packaging body

The invention claimed is:

1. A layered sheet comprising:
a substrate layer; and a surface layer configured to be layered on at least one surface of the substrate layer,
wherein the substrate layer contains a first thermoplastic resin and inorganic fillers,
wherein the surface layer contains a second thermoplastic resin and a conductive material,
wherein the second thermoplastic resin includes a polycarbonate resin and a polyester resin, and
wherein a content of the inorganic fillers in the substrate layer is 0.3 to 28 mass % based on a total amount of the substrate layer.

2. The layered sheet according to claim 1, wherein an average primary particle size of the inorganic fillers is 25 nm to 5.0 μm.

3. The layered sheet according to claim 1, wherein the substrate layer contains carbon black as the inorganic fillers.

4. The layered sheet according to claim 1, wherein the first thermoplastic resin includes a polycarbonate resin and a polyester resin, and the substrate layer contains, as the inorganic fillers, inorganic fillers formed of the same material as the conductive material contained in the surface layer.

5. The layered sheet according to claim 1, wherein a content of the conductive material in the surface layer is 10 to 30 mass % based on a total amount of the surface layer.

6. The layered sheet according to claim 1, wherein a thickness of the substrate layer is 70% to 97% of a thickness of the entire layered sheet.

7. A container configured to be a molded body of the layered sheet according to claim 1.

8. A carrier tape configured to be a molded body of the layered sheet according to claim 1 and be provided with an accommodation portion capable of accommodating an article.

9. An electronic component packaging body comprising:
the carrier tape according to claim 8;
an electronic component configured to be accommodated in the accommodation portion of the carrier tape; and
a cover film configured to be adhered to the carrier tape as a lid material.

10. The layered sheet according to claim 1, wherein the first thermoplastic resin includes a styrene-based resin.

11. A layered sheet comprising: a substrate layer; and a surface layer configured to be layered on at least one surface of the substrate layer, wherein the substrate layer contains a first thermoplastic resin and inorganic fillers, wherein the surface layer contains a second thermoplastic resin and a conductive material, and wherein the first thermoplastic resin includes a high-impact polystyrene resin, wherein the second thermoplastic resin includes a high-impact polystyrene resin.

12. The layered sheet according to claim 11, wherein an average primary particle size of the inorganic fillers is 25 nm to 5.0 μm.

13. The layered sheet according to claim 11, wherein the substrate layer contains carbon black as the inorganic fillers.

14. The layered sheet according to claim 11, wherein the substrate layer contains, as the first thermoplastic resin, a thermoplastic resin of the same kind as the second thermoplastic resin contained in the surface layer and contains, as the inorganic fillers, inorganic fillers formed of the same material as the conductive material contained in the surface layer.

15. The layered sheet according to claim 11, wherein a content of the conductive material in the surface layer is 10 to 30 mass % based on a total amount of the surface layer.

16. The layered sheet according to claim 11, wherein a thickness of the substrate layer is 70% to 97% of a thickness of the entire layered sheet.

17. A container configured to be a molded body of the layered sheet according to claim 11.

18. A carrier tape configured to be a molded body of the layered sheet according to claim 11 and be provided with an accommodation portion capable of accommodating an article.

19. An electronic component packaging body comprising:
the carrier tape according to claim 18;
an electronic component configured to be accommodated in the accommodation portion of the carrier tape; and
a cover film configured to be adhered to the carrier tape as a lid material.

* * * * *